United States Patent [19]

Davis et al.

[11] 3,964,920
[45] June 22, 1976

[54] SOLDER GLASS COMPOSITION AND METHOD OF USING SAME FOR ENCAPSULATING DEVICES

[75] Inventors: Earl K. Davis, Tempe; Kent W. Hansen; Duane C. Silvis, both of Scottsdale, all of Ariz.

[73] Assignee: Motorola, Inc., Chicago, Ill.

[22] Filed: Oct. 26, 1973

[21] Appl. No.: 409,843

[52] U.S. Cl. .................................. 106/53; 106/47 R
[51] Int. Cl.² .......................... C03C 3/04; C03C 3/10
[58] Field of Search ........................... 106/53, 47 R

[56] References Cited
UNITED STATES PATENTS

| | | | |
|---|---|---|---|
| 3,055,762 | 9/1962 | Hoffman | 106/53 |
| 3,258,350 | 6/1966 | Martin et al. | 106/47 R |
| 3,421,916 | 1/1969 | Nukoda et al. | 106/53 |
| 3,723,835 | 3/1973 | Davis et al. | 106/49 |
| 3,813,295 | 5/1974 | Mason et al. | 106/53 |

Primary Examiner—Winston A. Douglas
Assistant Examiner—Mark Bell
Attorney, Agent, or Firm—Ellen P. Trevors; Harry M. Weiss

[57] ABSTRACT

A method for sealing two ceramic pieces, a lead frame and a semiconductor chip together involving the application of pressure to a layer of sealing glass composition which remains vitreous throughout the sealing process is disclosed. The sealing glass composition comprises a mixture of sealing glass and zirconium silicate in the volume percentage amounts of 50–62 percent of glass and 50–38 percent of zirconium silicate. The glass components comprise, as a percentage weight of the glass alone, $SiO_2$ about 0–2 percent, PbO about 65–72 percent, ZnO about 5–10 percent, $PbF_2$ about 2–10 percent, CdO about 1–5 percent, $TiO_2$ about 0.5–3 percent and $B_2O_3$ about 10–14 percent.

6 Claims, 3 Drawing Figures

SOLDER GLASS COMPOSITION AND METHOD OF USING SAME FOR ENCAPSULATING DEVICES

BACKGROUND OF THE INVENTION

This invention relates to solder glass compositions and methods of using the same for encapsulating integrated circuits or other solid state devices in ceramic packages and it is an object of the invention to provide improved compositions and methods of this nature.

Many integrated circuit devices, or other solid state devices, are encapsulated, or packaged, in ceramic packages consisting of two layers of ceramic material bonded together by a solder glass. Seals of appropriate strength and hermeticity have been found in the past by utilizing relatively high temperatures and solder glasses which devitrified in the sealing process. The devitrification requires a substantial interval of time at the appropriate temperature such for example as 15 minutes at 450°–500°C. It was by devitrification that glasses were produced having the appropriate coefficients of thermal expansion for matching, in effect, those of the ceramic pieces.

In addition to the time of glass sealing, for example, the mounting of the integrated circuit or other solid state device upon a lead frame and that combination upon one of the ceramic layers was time consuming and costly because of the necessary wire bonds which had to be made. The length of time necessary raised the possibility at least of undesirable intermetallic compounds forming, as for example the gold-aluminum intermetallic known as purple plague.

Accordingly it is an object of the invention to provide improved solder glasses and methods of using same for eliminating the disadvantages of the prior art.

It is a further object of the invention to provide improved solder glasses of the nature indicated which are nondevitrifying in nature.

It is a further object of the invention to provide improved solder glasses of the nature indicated which require a greatly reduced period of time for forming a seal with ceramic pieces.

According to the invention strong hermetic seals having appropriate expansion characteristics may be formed in periods of time of less than one minute and at temperatures substantially less than 500°C.

BRIEF SUMMARY OF THE INVENTION

In carrying out the invention in one form there is provided a solder glass composition comprising a combination of solder glass and zirconium silicate in percentage amounts of solder glass of about 50–62 percent and $ZrSiO_4$ about 50–38 percent, respectively, the components of the solder glass comprising percentage amounts of the solder glass as follows: $SiO_2$ about 0–2 percent, PbO about 65–72 percent, ZnO about 5–10 percent, $PbF_2$ about 2–10 percent, CdO about 1–5 percent, $TiO_2$ about 0.5–3 percent and $B_2O_3$ about 10–14 percent.

In carrying out the invention according to another form there is provided a solder glass composition for developing a seal between two ceramic pieces at a temperature in the range of 400°–500°C, under a pressure in the range of 10–50 pounds per square inch and for a time in the range of 1–10 seconds comprising a combination of solder glass and zirconium silicate in percentage amounts of solder glass about 50–62 percent and $ZrSiO_4$ about 50–38 percent, respectively, the components of the solder glass comprising percentage amounts of the sealing glass as follows: $SiO_2$ about 0–2 percent, PbO about 65–72 percent, ZnO about 5–10 percent, $PbF_2$ about 2–10 percent, CdO about 1–5 percent, $TiO_2$ about 0.5–3 percent and $B_2O_3$ about 10–14 percent.

In brief, according to one form the invention comprises an improved solder glass composition and a method of using the same. The solder glass composition which comprises a mixture of components making up a sealing glass and an inert material which results in the desired temperature coefficient of expansion and strength without devitrification of the sealing glass produces a decreased flow characteristic of the combined material. However, it was found that by the application of relatively small amounts of force, or pressure, to the ceramic pieces after the solder glass has been disposed therebetween results in the desired seal being formed, the sealing glass composition flowing as is necessary to achieve this result under the applied pressure.

DESCRIPTION OF THE PREFERRED EMBODIMENT

Figure 1:
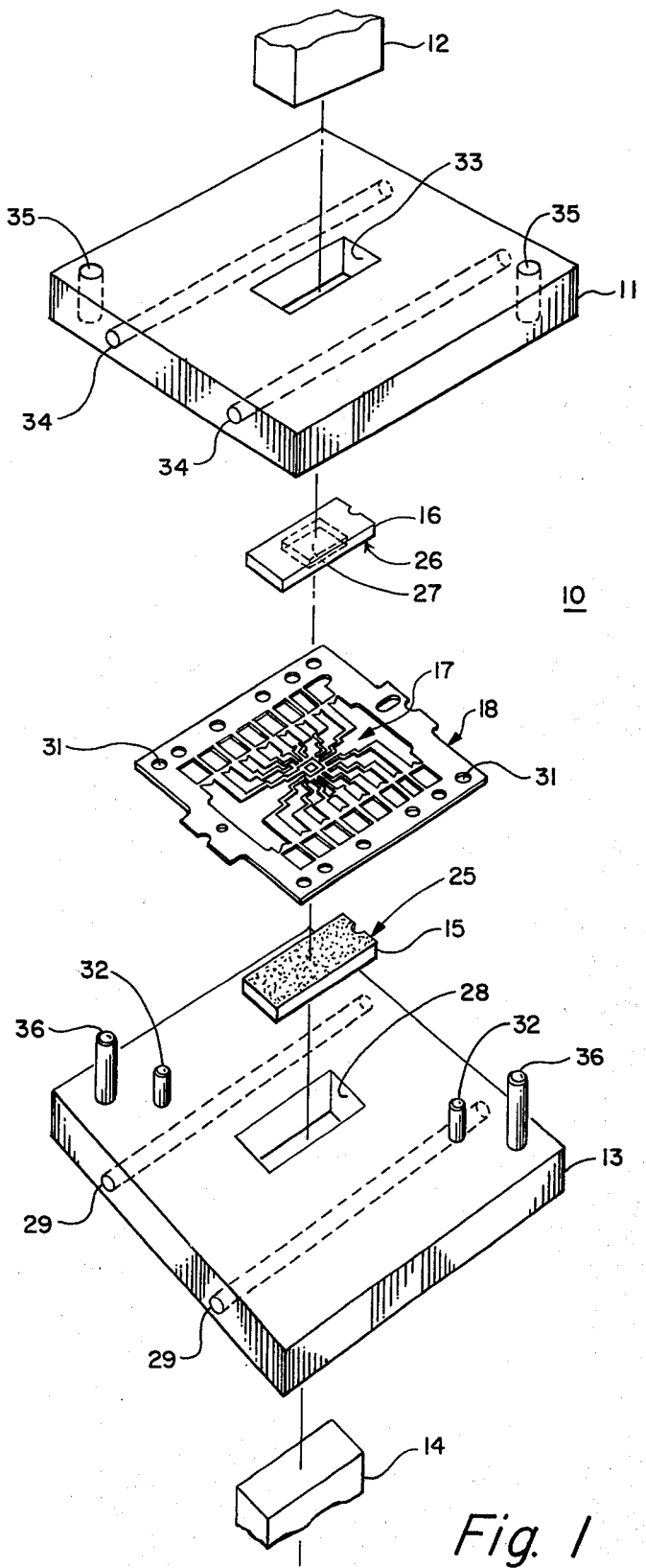
FIG. 1 is an exploded view in perspective of apparatus for carrying out the invention.

Referring to the drawings there is shown apparatus and structure for carrying out the invention including the composition of the sealing glass material for encapsulating, or packaging, integrated circuit or other semiconductor devices. Thus the apparatus 10 includes a top mold part 11, a top ram 12, a bottom mold part 13 and a bottom ram 14 cooperating as will be described for sealing ceramic parts 15 (base) and 16 (lid) and leads 17 of lead frame 18 together as will be more fully explained.

As one step in the process, an integrated circuit or semiconductor chip 19 is bonded to a flag 21 (FIGS. 2 and 3), the flag 21 terminating and being part of a conductor lead 22 (FIG. 3) which is part of the lead frame. Wire bonds 23 of gold wire, for example, are bonded from contact pads on the semiconductor chip 19 to the ends of the fingers forming the contacts 17 as is well understood. The dotted line 24 of FIG. 3 outlines that portion of the contact fingers which remain after the encapsulation has taken place and the excess portion of the lead frame has been severed as is also well understood in this art. The semiconductor chip 19 may be bonded to the flag 21 and the wire bonds 23 may be bonded to the chip and to the contact fingers as a series of steps in sequence before any encapsulation, or packaging, takes place.

Referring to FIG. 1 the ceramic base 15 which typically may be formed of alumina ($Al_2O_3$, aluminum oxide) includes a layer 25 of sealing glass composition, according to the invention, on its upper side. Similarly the ceramic lid 16 includes a layer 26 of sealing glass, according to the invention, on its bottom side. The lid 16 has a recess 27 extending inwardly from the bottom side thereof to receive the metal flag 21, the semiconductor chip 19 and the wire bonds 23 during the sealing operation.

During operation, the base 15 with the sealing glass layer 25 thereon is disposed in opening 28 in the mold part 13, the mold part being maintained at a temperature between 400°–500°C by appropriate heaters which for example may be heating units disposed in the elongated holes 29. The lead frame 18 with the semiconductor chip 19 bonded on the flag 21 is disposed over the base 15 and is appropriately located by any suitable means, for example, the holes 31 being received over locating pins 32. The ceramic top piece or lid 16 with the sealing glass layer 26 thereon is disposed in the opening 33 in the upper mold part 11 which also is maintained at a temperature between 400°–500°C by appropriate sealing means disposed in the elongated holes 34.

The lower ram 14 or punch is disposed in the opening 28, the upper ram or punch 12 is disposed in the opening 33 and the upper and lower mold parts 11 and 13 are placed together and appropriately located as, for example, by the holes 35 in the upper mold part 11 being received over the pins 36 in the lower mold part 13. The ceramic pieces 15 and 16 are thus held against the bottom and top surfaces of the leads 17 of the lead frame and are allowed to soak at the prescribed temperature for a period of about 5 to 60 seconds. Therefore a force is applied as with a hydraulic ram (not shown) against the punches or rams 12 and 14 for a period of about 1 to 10 seconds. The force may be 2–20 pounds for example on a ceramic piece one-quarter inch by three-quarters inch, for example, thereby giving a pressure of about 10 to 50 pounds per square inch. After the force has been exerted for a period of about 1 10 seconds the mold parts are separated and the assembled part cooled and removed.

Figure 2:
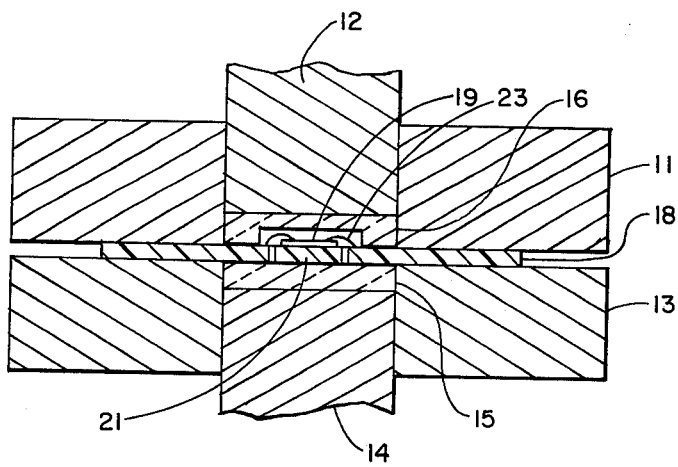
FIG. 2 is a sectional view of apparatus utilizing the invention in a latter stage of operation.
Figure 3:
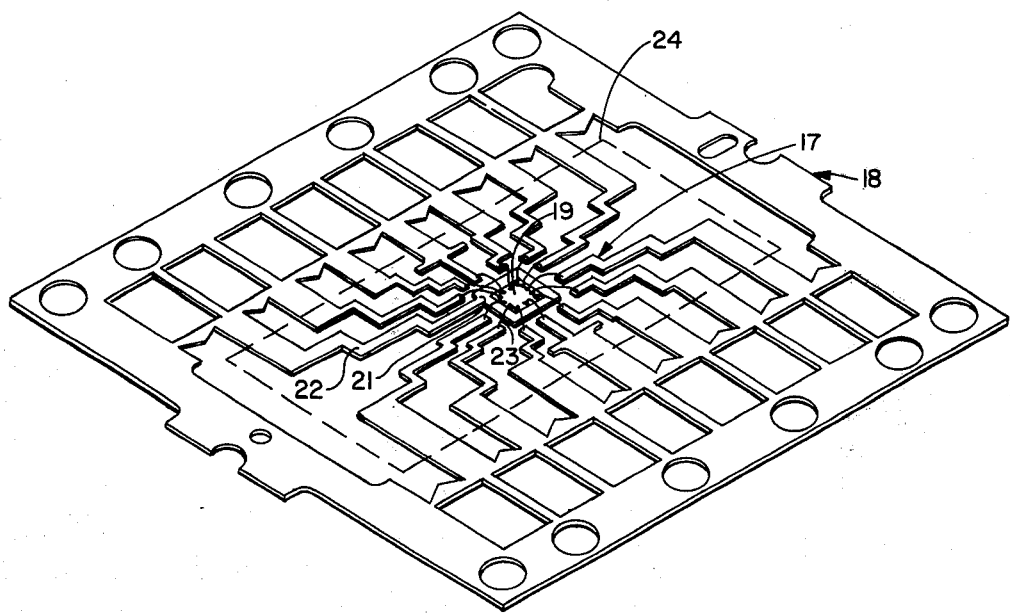
FIG. 3 is a perspective view of a lead frame utilized in practicing the invention.

Referring to FIG. 2, the ceramic pieces 15 and 16, the semiconductor chip 19 and the wire lead bonds 23 may be visualized together with the lead frame 18 at the time that the mold parts are together for the step of exerting force on the ceramic parts. Thus the mold parts 11 and 13 are shown bearing against the surfaces of the lead frame 18 and the rams 12 and 14 are shown bearing against the lid and base 16 and 15 respectively.

A critical element of this invention is the composition of the glass forming the layers 25 and 26 in order to achieve the short sealing time of 1 to 10 seconds at the temperature indicated. It is necessary that the glass remain essentially vitreous during the sealing operation.

The solder glass according to the invention comprises a mixture of sealing glass ingredients and zircon (zirconium silicate, $ZrSiO_4$).

The ingredients of the sealing glass are set out in Table I according to chemical formula, the weight range in percent, the preferred weight in percent, the name of the materials and the weight in grams thereof for one particular batch.

TABLE I

| Chem Form. | Wt. % Range | Wt. % Preferred | Material Used | Wt. (gm) |
| --- | --- | --- | --- | --- |
| $SiO_2$ | 0–2 | 1.0 | Pennsylvania Silica Sand | 10.0 |
| PbO | 65–72 | 70.0 | Litharge (Hammond 150Y) | 650.0 |
|  |  |  | Red Lead (Hammond UHP) | 50.9 |
| ZnO | 5–10 | 9.0 | Zinc Oxide (Kadox 215) | 90.0 |
| $PbF_2$ | 2–10 | 5.0 | Lead Fluoride | 50.0 |
| CdO | 1–5 | 2.0 | Cadmium Oxide | 20.0 |
| $TiO_2$ | 0.5–3 | 1.0 | Titanium Dioxide | 10.0 |
| $B_2O_3$ | 10–14 | 12.0 | Boric Acid ($H_3BO_3$) | 213.1 |

TABLE I-continued

| Chem Form. | Wt. % Range | Wt. % Preferred | Material Used | Wt. (gm) |
| --- | --- | --- | --- | --- |
|  |  |  |  | 1094.0 |

For the preferred form of sealing glass the batch components in grams were weighed and blended and after blending were melted at 900°C in a platinum crucible. After melting the melt was homogenized by stirring and the molten glass was poured into deionized water to form a frit. Thereafter the frit was ball milled for a period of time which for example could be about two hours and then was then screened through a 150 mesh screen.

The resulting screened frit was mixed with zircon (zirconium silicate, $ZrSiO_4$) which had been screened through a 325 mesh screen and the resultant mixture was ball milled for a certain length of time, for example one hour.

The volume percentages of glass and zircon tested are set forth in Table II, the percentage of glass varying by volume from 50 percent to 62 percent and the zircon varying in volume percentage from 50 percent to 38 percent, the preferred mixture being that of 56 percent glass and 44 percent zircon.

TABLE II

Volume Percentages of Glass and Zircon Test

| | Glass-Zircon Volume Percentage Mixtures | | |
| --- | --- | --- | --- |
|  | 1 | 2 | 3 |
| Glass | 50 | 56 | 62 |
| Zircon | 50 | 44 | 38 |

The mixture of ball milled glass and zircon was mixed with a suitable binder and solvent, or vehicle, in order to form a slurry. The slurry was screened printed on the appropriate surfaces of the ceramic pieces 15 and 16 and was dried at about 100°C for a suitable period of time, for example about one hour to two hours. Thereafter the dried pieces were heated for about 300°–350°C for about 15 to 45 minutes for example to drive off the remaining solvent. Between 5 and 10 mils thickness of glass mixture were applied to the ceramic surfaces. After driving out the solvent the ceramic parts were fired at 460°–480°C to glaze the glass for a period of 2 to 10 minutes for example. Thereafter they were permitted to cool and were in condition to be used in a sealing operation as described.

Since the lead frame 18 includes the flag 21, the die 19 may be directly attached to it rather than to the ceramic base 15 as is the case with conventional packages. Thus the invention allows one to seal the base 15 to the lid or cover 16 during the final stages of assembly and to omit the embedment of leads to the base 15 during die attachment as is presently done.

Critical elements of the subject invention are the glass layers 25 and 26. To achieve a short sealing time of 1 to 10 seconds as already described, a glass that remains essentially vitreous during the sealing, or encapsulating, operation is necessary and one which is suitable for mixing with zircon. The glass as described herein, according to differential thermal analyses, should devitrify. However, the exothermic peak that corresponds to crystallization is broad and not large as compared with known solder glasses. Therefore, the degree of crystallization, or devitrification, during the short sealing process is very small, if not existent. It is possible to use a devitrifying glass with the process, according to the invention; however, the parts must be soaked at the crystallization, or devitrification, temperature for several minutes in the mold, or be given a subsequent treatment, to obtain optimum devitrification. Therefore vitreous glasses with the ceramic additions are preferred as already described.

The glass according to the invention had the physical properties as shown in Table III.

TABLE III

Physical Properties of the Sealing Glass Without Zircon

| | |
|---|---|
| Annealing Point* | 309°C |
| Thermal Expansion Coefficient (average 25–250°C) | $107 \times 10^{-7}$/°C |
| Density | 6.43 gm/cc |

*Determined by differential thermal analysis

The modulus of rupture (MOR) of fired samples of the mixtures shown in Table II were measured and are as follows:

TABLE IV

Modulus of Rupture (in psi) of Sealing Glass and Zircon Mixtures of Table II.

| | Material Glass-zircon mixture from Table II | | |
|---|---|---|---|
| Firing Conditions | 1 | 2 | 3 |
| 450°C for 15 min. | 10,900 | 10,600 | 9,063 |

The MOR was measured using an Instron testing unit with a four-point loading jig. A constant loading rate of 0.05 cm/sec was used. Bars approximately 2½ inches long and ¼ × ¼ inch were dry pressed and fired at the temperature shown in Table IV.

The glass with zircon additives were considerably stronger than solder glasses presently being used. The higher strength contributes to more integrity in a glass seal because larger stresses which result from thermal fluctuations and mechanical shock are needed to fracture the glass-zircon mixtures than are needed with other solder glasses.

The thermal expansion coefficient of the mixture shown in Table II was measured using an automatically recording dilatometer. The test specimens were bars one inch in length which had been fired under the conditions shown in Table V.

TABLE V

Thermal expansion coefficient ($\alpha$) of glass-zircon mixtures in Table II.
$\alpha \times 10^{-7}$/°C (25°C to 250°C)

| Mixtures | Heat Treatment | Measured |
|---|---|---|
| 1 | 450°C for 15 min. | 60 |
| 2 | 465°C for 15 min. | 61 |
| | 440°C for 15 min. | 60 |
| 3 | 450°C for 15 min. | 68 |
| | 400°C for 30 min. | 69 |

The coefficient of thermal expansion of the ceramic pieces 15 and 16, made of alumina, was $64 \times 10^{-7}$/°C. It will be noted that the solder glass mixtures and the ceramic pieces 15 and 16 have thermal coefficients which are very close together. This minimizes stresses due to thermal expansion mismatch and therefore results in a package which can tolerate larger thermal excursions with less failures.

The method described for assembling ceramic parts with a very short cycle time achieves the desirable end by hot pressing using the disclosed glass zircon mixtures.

The advantages of the disclosed process, materials and resultant packages include improved electrical integrity and reduced intermetallic reactions because of very short sealing times, a sealing method which lends itself to automation, and therefore lower packaging costs, a stronger solder glass material than is presently being used, a solder glass with improved thermal expansion coefficient for ceramic packages and a solder glass with improved resistance to chemical solutions used in electroplating.

What is claimed is:

1. A non-devitrifying solder glass composition consisting essentially of about 50–62 percent by volume of sealing glass and about 50–38 percent by volume of $ZrSiO_4$, said sealing glass consisting essentially of by weight: $SiO_2$ about 0–2 percent, PbO about 65–72 percent, ZnO about 5–10 percent, $PbF_2$ about 2–10 percent, CdO about 1–5 percent, $TiO_2$ about 0.5–3 percent and $B_2O_3$ about 10–14 percent.

2. The non-devitrifying solder glass composition according to claim 1 wherein said sealing glass consists essentially of by weight: $SiO_2$ about 1 percent, PbO about 70 percent, ZnO about 9 percent, $PbF_2$ about 5 percent, CdO about 2 percent, $TiO_2$ about 1 percent and $B_2O_3$ about 12 percent.

3. The non-devitrifying solder glass composition according to claim 1 wherein the percentage amounts of sealing glass and $ZrSiO_4$ are about 50 percent by volume sealing glass and 50 percent by volume $ZrSiO_4$, respectively.

4. The non-devitrifying solder glass composition according to claim 1 wherein the percentage amounts of sealing glass and $ZrSiO_4$ are about 56 percent by volume sealing glass and 44 percent by volume $ZrSiO_4$, respectively.

5. The non-devitrifying solder glass composition according to claim 1 wherein the percentage amounts of sealing glass and $ZrSiO_4$ are about 62 percent by volume sealing glass and 38 percent by volume $ZrSiO_4$, respectively.

6. The non-devitrifying solder glass composition according to claim 1 wherein the percentage amounts of sealing glass and $ZrSiO_4$ are about 56 percent by volume sealing glass and 44 percent by volume $ZrSiO_4$, respectively and said sealing glass consists essentially of by weight: $SiO_2$ about 1 percent, PbO about 70 percent, ZnO about 9 percent, $PbF_2$ about 5 percent, CdO about 2 percent, $TiO_2$ about 1 percent and $B_2O_3$ about 12 percent.

* * * * *